(12) United States Patent
Zhou

(10) Patent No.: US 11,569,272 B2
(45) Date of Patent: Jan. 31, 2023

(54) ARRAY SUBSTRATE AND DISPLAY PANEL

(71) Applicant: TCL CHINA STAR OPTOELECTRONICS TECHNOLOGY CO., LTD., Guangdong (CN)

(72) Inventor: Deli Zhou, Guangdong (CN)

(73) Assignee: TCL CHINA STAR OPTOELECTRONICS TECHNOLOGY CO., LTD, Guangdong (CN)

( * ) Notice: Subject to any disclaimer, the term of this patent is extended or adjusted under 35 U.S.C. 154(b) by 432 days.

(21) Appl. No.: 16/756,478

(22) PCT Filed: Mar. 24, 2020

(86) PCT No.: PCT/CN2020/080878
§ 371 (c)(1),
(2) Date: Apr. 16, 2020

(87) PCT Pub. No.: WO2021/179348
PCT Pub. Date: Sep. 16, 2021

(65) Prior Publication Data
US 2022/0310666 A1    Sep. 29, 2022

(30) Foreign Application Priority Data

Mar. 9, 2020   (CN) .......................... 202010157257.3

(51) Int. Cl.
*H01L 27/12* (2006.01)
(52) U.S. Cl.
CPC ................................ *H01L 27/1244* (2013.01)

(58) Field of Classification Search
None
See application file for complete search history.

(56) References Cited

U.S. PATENT DOCUMENTS

| | | | |
|---|---|---|---|
| 6,429,909 B1 * | 8/2002 | Kim | ...................... G02F 1/1309 349/143 |
| 6,717,634 B2 | 4/2004 | Kim et al. | |
| 10,236,335 B2 * | 3/2019 | Oh | ......................... H01L 27/124 |
| 2012/0050662 A1 | 3/2012 | Hsu et al. | |

FOREIGN PATENT DOCUMENTS

| | | |
|---|---|---|
| CN | 1945410 A | 4/2007 |
| CN | 101566770 A | 10/2009 |
| CN | 101833202 A | 9/2010 |
| CN | 201984264 U | 9/2011 |
| CN | 110262146 A | 9/2019 |
| CN | 110531542 A | 12/2019 |
| KR | 20000002802 A | 1/2000 |

* cited by examiner

*Primary Examiner* — Bo B Jang
(74) *Attorney, Agent, or Firm* — Soroker Agmon Nordman

(57) ABSTRACT

An array substrate and a display panel are provided. The array substrate includes a data line, a thin film transistor having a gate and a source, a source wire, and a scan line. The source wire includes a predetermined breaking part configured to be cut off to break an electrical connection between the source and the data line. The scan line and the predetermined breaking part have a first predetermined distance in-between, and the first predetermined distance is used to prevent the scan line and the data line from forming a short circuit when a fixing operation is being performed.

18 Claims, 3 Drawing Sheets

ARRAY SUBSTRATE AND DISPLAY PANEL

FIELD OF THE INVENTION

The present invention relates to a display technique, and more particularly, to an array substrate and a display panel.

BACKGROUND OF THE INVENTION

In the manufacturing process of the array substrate, there might be residues of metal fractions or particles in a thin film transistor (TFT) because of the influences of the production line or the external environment. This makes the pixel driven by the TFT become a bright dot and thus the display panel incorrectly displays. Therefore, a dark spot fixing operation needs to be performed on that pixel to improve the display performance of the display panel.

Because the source of the TFT is connected to the data line through the source wire, in the dark spot fixing operation, the source wire is usually cut to break the electrical connection between the source and the data line.

However, when a laser is used to cut the source wire, the scan line and the data line may become a short circuit because the distance between the source wire and the scan line is short. This introduces a cross curve and reduces the product yield.

SUMMARY OF THE INVENTION

One objective of an embodiment of the present invention is to provide an array substrate and a display panel to solve the above-mentioned issues of cross curve and product yield.

According to an embodiment of the present invention, an array substrate is disclosed. The array substrate comprises: a data line; a thin film transistor, comprising a gate, a source, and a drain; a plurality of pixel electrodes arranged in an array, wherein each drain is electrically connected to an electrode of the plurality of pixel electrodes in a one-by-one correspondence; a source wire, wherein one end of the source wire is electrically connected to the source and another end of the source wire is electrically connected to the data line, and the source wire comprises a predetermined breaking part, configured to be cut off to break an electrical connection between the source and the data line; a scan line, arranged across the data line, wherein the scan line and the predetermined breaking part have a first predetermined distance in-between, and the first predetermined distance is used to prevent the scan line and the data line from forming a short circuit when a fixing operation is being performed; and a common line, arranged in parallel with the scan line and located at one side of the source wire opposite to the scan line; wherein the common line and the predetermined breaking part have a second predetermined distance in-between, and the second predetermined distance is used to prevent the common line and the data line from forming a short circuit when a fixing operation is being performed.

According to an embodiment of the present invention, the predetermined breaking part locates on one side of the source wire close to the data line.

According to an embodiment of the present invention, the scan line comprises a connecting part and a bending part, the connecting part is electrically connected to the gate, the bending part is connected to one side of the connecting part, which is close to the data line, and the bending part and the predetermined breaking part has the predetermined distance in-between.

According to an embodiment of the present invention, the bending part comprises a tilting section and a horizontal section connected to the tilting section, the tilting section comprises a first end and a second end, the first end is connected to the connecting part and the second end is connected to the horizontal section; wherein a distance between the tiling section and the predetermined breaking part increases from the first end to the second end, and a distance between the horizontal section and the predetermined breaking part is the first predetermined distance.

According to an embodiment of the present invention, the common line has a groove located on one side of the common line, which is close to the data line;

wherein a bottom of the groove and the predetermined breaking part have the predetermined distance in-between.

According to an embodiment of the present invention, the first predetermined distance and the second predetermined distance are both longer than or equal to 6 mm.

According to an embodiment of the present invention, the scan line and the common line are located at a same layer.

According to an embodiment of the present invention, an array substrate includes: a data line; a thin film transistor, comprising a gate, a source, and a drain; a source wire, wherein one end of the source wire is electrically connected to the source and another end of the source wire is electrically connected to the data line, and the source wire comprises a predetermined breaking part, configured to be cut off to break an electrical connection between the source and the data line; and a scan line, arranged across the data line, wherein the scan line and the predetermined breaking part have a first predetermined distance in-between, and the first predetermined distance is used to prevent the scan line and the data line from forming a short circuit when a fixing operation is being performed.

According to an embodiment of the present invention, the array substrate further comprises a common line, arranged in parallel with the scan line and located at one side of the source wire opposite to the scan line, wherein the common line and the predetermined breaking part have a second predetermined distance in-between, and the second predetermined distance is used to prevent the common line and the data line from forming a short circuit when a fixing operation is being performed.

According to an embodiment of the present invention, the predetermined breaking part locates on one side of the source wire close to the data line.

According to an embodiment of the present invention, the scan line comprises a connecting part and a bending part, the connecting part is electrically connected to the gate, the bending part is connected to one side of the connecting part, which is close to the data line, and the bending part and the predetermined breaking part has the predetermined distance in-between.

According to an embodiment of the present invention, the bending part comprises a tilting section and a horizontal section connected to the tilting section, the tilting section comprises a first end and a second end, the first end is connected to the connecting part and the second end is connected to the horizontal section;

wherein a distance between the tiling section and the predetermined breaking part increases from the first end to the second end, and a distance between the horizontal section and the predetermined breaking part is the first predetermined distance.

According to an embodiment of the present invention, the common line has a groove located on one side of the common line, which is close to the data line;

wherein a bottom of the groove and the predetermined breaking part have the predetermined distance in-between.

According to an embodiment of the present invention, the first predetermined distance and the second predetermined distance are both longer than or equal to 6 mm.

According to an embodiment of the present invention, the scan line and the common line are located at a same layer.

According to an embodiment of the present invention, a plurality of pixel electrodes arranged in an array, wherein each drain is electrically connected to an electrode of the plurality of pixel electrodes in a one-by-one correspondence.

According to an embodiment of the present invention, a display panel comprising an array substrate is provided. The array substrate includes: a data line; a thin film transistor, comprising a gate, a source, and a drain; a source wire, wherein one end of the source wire is electrically connected to the source and another end of the source wire is electrically connected to the data line, and the source wire comprises a predetermined breaking part, configured to be cut off to break an electrical connection between the source and the data line; and a scan line, arranged across the data line, wherein the scan line and the predetermined breaking part have a first predetermined distance in-between, and the first predetermined distance is used to prevent the scan line and the data line from forming a short circuit when a fixing operation is being performed.

According to an embodiment of the present invention, the array substrate further comprises a common line, arranged in parallel with the scan line and located at one side of the source wire opposite to the scan line, wherein the common line and the predetermined breaking part have a second predetermined distance in-between, and the second predetermined distance is used to prevent the common line and the data line from forming a short circuit when a fixing operation is being performed.

According to an embodiment of the present invention, the predetermined breaking part locates on one side of the source wire close to the data line.

According to an embodiment of the present invention, the scan line comprises a connecting part and a bending part, the connecting part is electrically connected to the gate, the bending part is connected to one side of the connecting part, which is close to the data line, and the bending part and the predetermined breaking part has the predetermined distance in-between.

In contrast to the conventional art, an array substrate of an embodiment set a predetermined distance between the scan line and a predetermined breaking part of the source wire. This increases the space between the scan line and the predetermined breaking part. Thus, when the cutting operation is performed on the predetermined breaking part, the scan line and the data line could be perverted from forming a short circuit. This improves the above issues of cross curve and product yield.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF PREFERRED EMBODIMENTS

Figure 1:
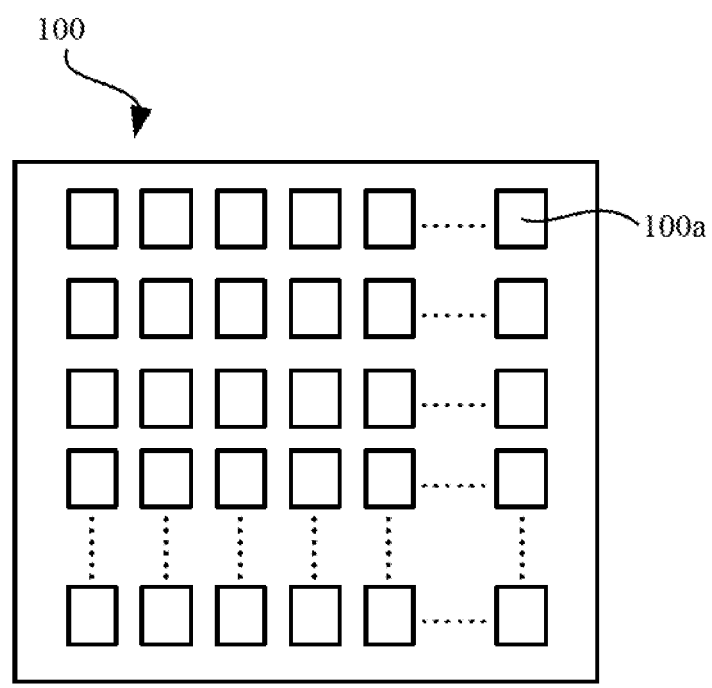
FIG. 1 is a diagram of a structure of an array substrate according to an embodiment of the present invention.

To help a person skilled in the art better understand the solutions of the present disclosure, the following dearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

All of the terminologies containing one or more technical or scientific terminologies have the same meanings that persons skilled in the art understand ordinarily unless they are not defined otherwise. For example, "upper" or "lower" of a first characteristic and a second characteristic may include a direct touch between the first and second characteristics. The first and second characteristics are not directly touched; instead, the first and second characteristics are touched via other characteristics between the first and second characteristics. Besides, the first characteristic arranged on/above/over the second characteristic implies that the first characteristic arranged right above/obliquely above or merely means that the level of the first characteristic is higher than the level of the second characteristic. The first characteristic arranged under/below/beneath the second characteristic implies that the first characteristic arranged right under/obliquely under or merely means that the level of the first characteristic is lower than the level of the second characteristic.

Different methods or examples are introduced to elaborate different structures in the embodiments of the present disclosure. To simplify the method, only specific components and devices are elaborated by the present disclosure. These embodiments are truly exemplary instead of limiting the present disclosure. Identical numbers and/or letters for reference are used repeatedly in different examples for simplification and clearance. It does not imply that the relations between the methods and/or arrangement. The methods proposed by the present disclosure provide a variety of examples with a variety of processes and materials. However, persons skilled in the art understand ordinarily that the application of other processes and/or the use of other kinds of materials are possible.

In this embodiment, the array substrate comprises a plurality of sub-pixels arranged in an array. Each of the sub-pixels comprises a pixel electrode, a TFT, and etc. In the following disclosure, one sub-pixel is used as an example to illustrate, but this is not a limitation of the present invention.

Furthermore, the structure of the sub-pixel shown in the figures is just an example for illustrating each embodiment of the present invention, but not a limitation of the present invention.

It could be understood that the structure of the sub-pixel could be an 8-domain pixel structure driven by 3 TFTs, a 4-domain pixel structure driven by one TFT, or any other pixel structure. In the following disclosure, the 8-domain pixel structure driven by 3 TFTs is used as an example for illustration, but not a limitation of the present invention.

Figure 2:
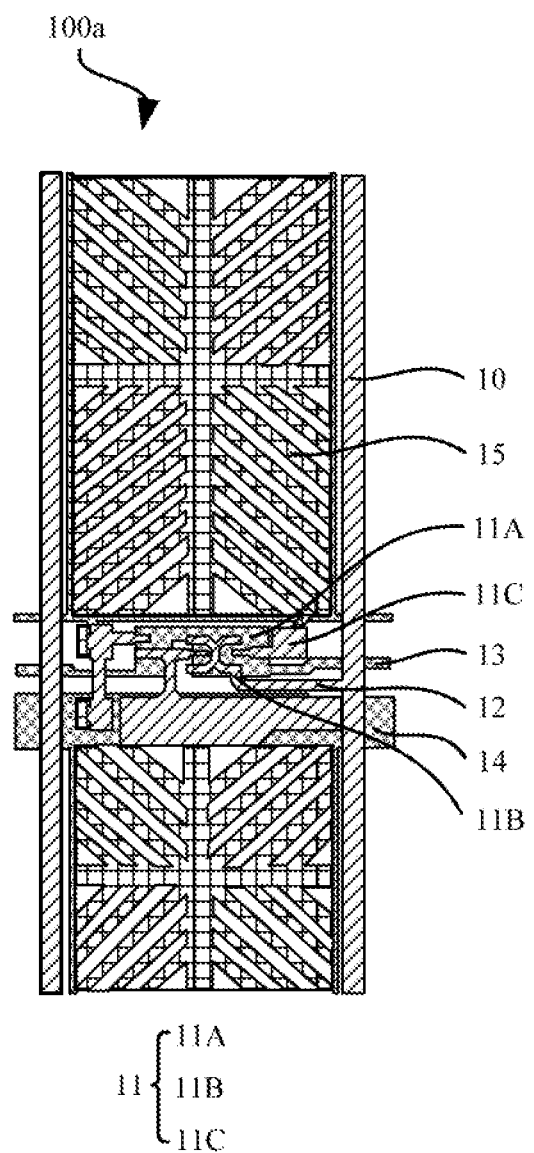
FIG. 2 is a diagram of a sub-pixel in an array substrate according to an embodiment of the present invention.
Figure 3:
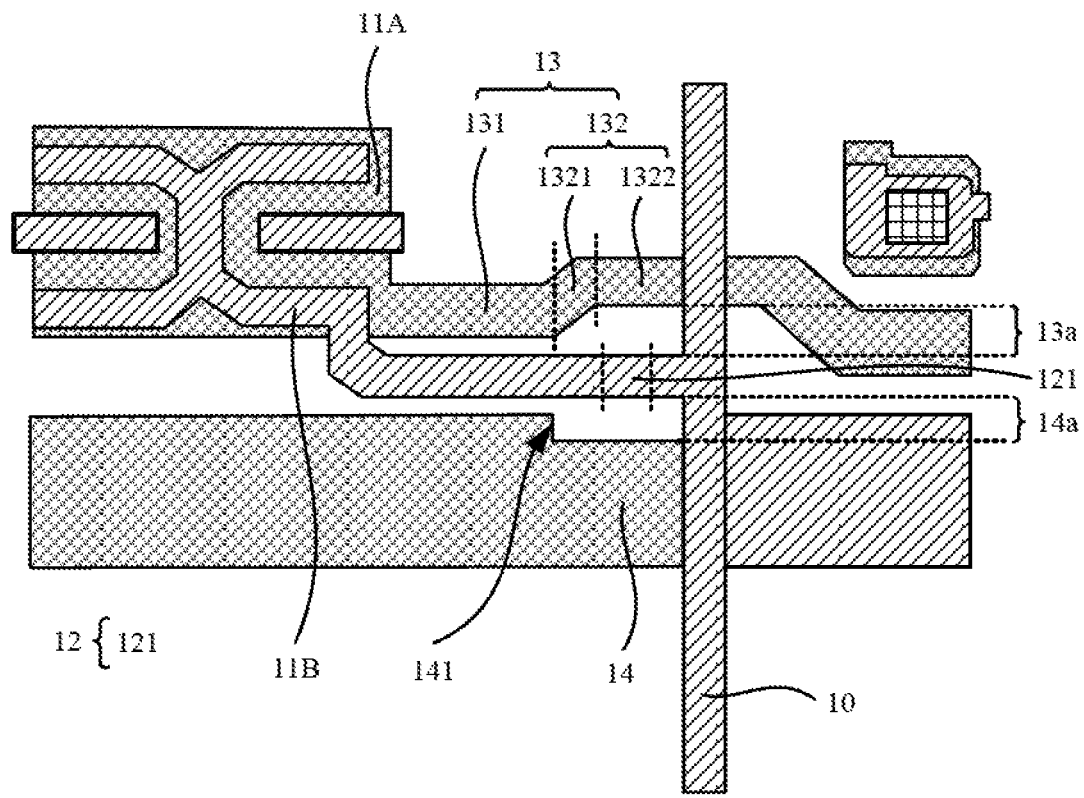
FIG. 3 is a diagram of a structure of a part of an array substrate according to an embodiment of the present invention.

Please refer to FIG. 1 to FIG. 3. The array substrate 100 comprises a data line 10, a TFT 11, a source wire 12, a scan line 13 and a common line 14. The TFT 11 comprises a gate 11A and a source 118. One end of the source wire 12 is electrically connected to the source 11B and the other end of the source wire 12 is electrically connected to the data line 10. The source wire 12 comprises a predetermined breaking part 121. The predetermined breaking part 121 is used to be cut to break the connection between the source 11B and the data line 10. The scan line 13 is arranged across the data line 10. The scan line 13 and the predetermined breaking part 121 have the first predetermined distance 13a in-between. The first predetermined distance 13a is used to prevent the scan line 13 and the data line 10 from forming a short circuit when the fixing operation is performed.

The array substrate 100 of this embodiment sets the predetermined distance 13a between the scan line 13 and the predetermined breaking part 121 of the source wire 12 in order to increase the space between the scan line 13 and the predetermined breaking part 121 of the source wire 12. This prevents the scan line 13 and the data line 10 from forming a short circuit when the predetermined breaking part 121 is cut in the dark spot fixing operation. This improves the issue of cross curve and raises the yield.

In this embodiment, the sub-pixel 100a comprises three TFTs. The TFT 11 is one of the three TFTs. The structures of the other two TFTs (not shown) are well-known and thus further illustration is omitted.

In this embodiment, the predetermined breaking part 121 is located at a side of the source wire 12 that is close to the data line 10. The position of the predetermined breaking part 121 could be determined according to the actual implementation and thus is not a limitation of the present invention.

In addition, the size of the predetermined breaking part 121 in this embodiment is also an example for illustration but not a limitation of the present invention.

Furthermore, in this embodiment, the common line 14 and the scan line 13 are arranged in parallel, and the common line 14 is located at a side of the source wire 12 that is opposite to the scan line 13. The common line 14 and the predetermined breaking part 121 have the second predetermined distance 14a in-between. The second predetermined distance 14a is used to prevent the common line 14 and the data line 10 from forming a short circuit when a fixing operation is performed.

The above arrangement sets the second predetermined distance 14a between the common line 14 and the predetermined breaking part 121 of the source wire 12 in order to increase the space between the common line 14 and the predetermined breaking part 121. This prevents the common line 14 and the data line 10 from forming a short circuit when the predetermined breaking part 121 is cut in the dark spot fixing operation. This improves the issue of cross curve and raises the yield.

The first predetermined distance 13a and the second predetermined distance 14a are both longer than or equal to 6 mm. This arrangement could ensure that there is an enough safe space between the scan line 13 and the predetermined breaking part 121 and the common line 14 and the predetermined breaking part 121 to prevent from any bad influence when the laser is used to cut the predetermined breaking part 121. For example, this prevents the data line and the scan line 13/the common line 14 from forming a short circuit and thus raises the yield.

The first predetermined distance 13a and the second predetermined distance 14a can be equal or not equal. The lengths of the first predetermined distance 13a and the second predetermined distance 14a could be determined according to the actual implementation and not a limitation of the present invention.

Figure 4:
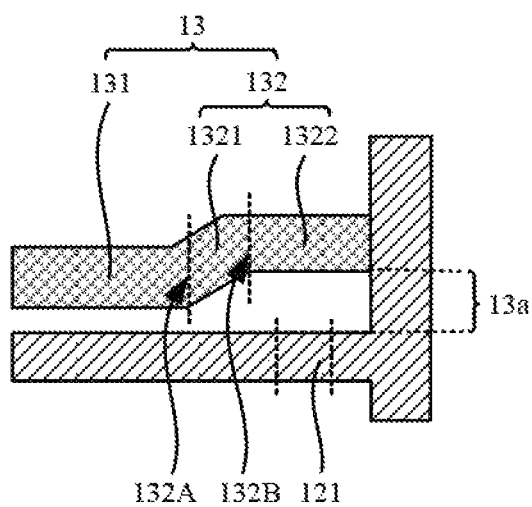
FIG. 4 is a scale-up diagram of a partial structure shown in FIG. 3.

Please refer to FIG. 3 and FIG. 4. FIG. 4 is a scale-up diagram of a partial structure shown in FIG. 3.

In this embodiment, the scan line 13 comprises the connecting part 131 and the bending part 132. The connecting part is electrically connected to the gate 11A. The bending part 132 is connected to the side of the connecting part 131 that is close to the data line. The bending part 132 and the predetermined breaking part 121 have the first predetermined distance 13a in-between.

Because the first predetermined distance 13a is set between the bending part 132 and the predetermined breaking part 121, the space between the part of the scan line 13 corresponding to the predetermined breaking part 121 and the predetermined breaking part 121 becomes larger. In this way, an enough space can be ensured when the laser is used to cut the predetermined breaking part 121. This prevents the remaining source wire 12 and the scan line 13 from forming a short circuit. This eliminates the risk of forming a short circuit of the scan line 13 and the data line 10.

At the side opposite to the data line, the scan line 13 further comprises another tilting section and another connecting section (not shown) connected to the tilting section. This tilting section and the tilting section 1321 are arranged correspondingly. This connecting section and the connecting section 131 are arranged correspondingly. The above arrangement could prevent the scan line 13 from contacting peripheral circuits and thus reduce the risk of forming a short circuit of the scan line 13 and peripheral circuits.

The peripheral circuits are well known and thus further illustration is omitted here.

Furthermore, the bending part 132 comprises the tilting section 1321 and the horizontal section 1322 connected to the tilting section 1321. The tilting section 1321 comprises the first end 132A and the second end 132B. The first end 132A is connected to the connecting part 131. The second end 132B is connected to the horizontal section 1322. Here, the distance between the tilting section 1321 and the predetermined breaking part 121 increases from the first end 132A to the second end 132B. The distance between the horizontal section 1322 and the predetermined breaking part 121 is the first predetermined distance 13a.

In the vertical direction, because the tilting section 1321 is located at the outer side of the predetermined breaking part, this arrangement reserves a buffer space by setting the vertical distance between the tilting section 1321 and the predetermined breaking part 121 gradually increases. In the buffer space, the distance between the scan line 13 and the source wire gradually increases. This arrangement not only effectively reduces the risk of the short circuit due to the cutting operation by the laser, but also ensures the peripheral circuits of the predetermined breaking part 121 to be conductive.

The present invention does not limit the structure of the bending part 132. As long as there is the predetermined distance 13a between the horizontal section 1322 and the predetermined breaking part 121, all the variations fall within the scope of the present invention.

In this embodiment, a groove 141 is on the common line 14. The groove 141 is located on one side of the common line 14 that is close to the data line 10. The distance between the bottom of the groove 131 and the predetermined breaking part 121 is the second predetermined distance 14a.

The above arrangement sets a groove 141 on the common line 14. This makes the space between the part of the common line 14 corresponding to the predetermined breaking part 121 and the predetermined breaking part 121 larger. In this way, when the predetermined breaking part 121 is being cut, an enough cutting space could be ensured. This prevents the remaining source wire 12 and the common line 14 from forming a short circuit and thus reduces the risk that the common line 14 and the data line 10 form a short circuit.

The shape of the cross-section of the groove 141 is not limited. As long as the distance between the bottom of the groove 141 and the predetermined breaking part 121 is the second predetermined distance 14a, all variances fall within the scope of the present invention.

The scan line 13 and the common line 14 are arranged in the same layer. In some embodiments, the scan line 13 and the common line 14 could be arranged in different layers. Further illustration is omitted here.

The array substrate 100 further comprises multiple pixel electrodes 15 arranged in an array. Each of the TFTs 11 further comprises a drain 11c. Each of the drain 11c is electrically connected to a pixel electrode 15 in a one-by-one correspondence. In addition, the film structure of the array substrate 100 is well known and further illustration is omitted here.

In an embodiment, the array substrate 100 sets the first predetermined distance 13a between the scan line 13 and the predetermined breaking part 121 of the source wire 12 and sets the second predetermined distance 14a between the common line 14 and the predetermined breaking part 121 of the source wire 12. This increase the space between the scan line 13 and the predetermined breaking part 121 and the space between the common line 14 and the predetermined breaking part 121. This prevents the data line 10 and the scan line 13/the common line 14 from forming a short circuit when the predetermined breaking part 121 is being cut in the dark spot fixing operation. This reduces the issues of cross curve and raises the yield.

According to another embodiment of the present invention, a display panel is disclosed. The display panel comprises the array substrate 100. The array substrate 100 could be the array substrate 100 in the above embodiments and further illustration is omitted here.

In contrast to the conventional art, an array substrate of an embodiment set a predetermined distance between the scan line and a predetermined breaking part of the source wire. This increases the space between the scan line and the predetermined breaking part. Thus, when the cutting operation is performed on the predetermined breaking part, the scan line and the data line could be perverted from forming a short circuit. This improves the above issues of cross curve and product yield.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate, comprising:
   a data line:
   a thin film transistor, comprising a gate, a source, and a drain;
   a plurality of pixel electrodes arranged in an array, wherein each drain is electrically connected to an electrode of the plurality of pixel electrodes in a one-by-one correspondence;
   a source wire, wherein one end of the source wire is electrically connected to the source and another end of the source wire is electrically connected to the data line, and the source wire comprises a predetermined breaking part, configured to be cut off to break an electrical connection between the source and the data line;
   a scan line, arranged across the data line, wherein the scan line and the predetermined breaking part have a first predetermined distance in-between, and the first predetermined distance is used to prevent the scan line and the data line from forming a short circuit when a fixing operation is being performed; and
   a common line, arranged in parallel with the scan line and located at one side of the source wire opposite to the scan line;
   wherein the common line and the predetermined breaking part have a second predetermined distance in-between, and the second predetermined distance is used to prevent the common line and the data line from forming a short circuit when a fixing operation is being performed.

2. The array substrate of claim 1. wherein the predetermined breaking part is located on one side of the source wire close to the data line.

3. The array substrate of claim 2, wherein the scan line comprises a connecting part and a bending part, the connecting part is electrically connected to the gate. the bending part is connected to one side of the connecting part, which is close to the data line, and the bending part and the predetermined breaking part have the first predetermined distance in-between.

4. The array substrate of claim 3, wherein the bending part comprises a tilting section and a horizontal section connected to the tilting section, the tilting section comprises a first end and a second end, the first end is connected to the connecting part and the second end is connected to the horizontal section;

wherein a distance between the tiling section and the predetermined breaking part increases from the first end to the second end, and a distance between the horizontal section and the predetermined breaking part is the first predetermined distance.

5. The array substrate of claim 2, wherein the common line has a groove located on one side of the common line, which is close to the data line;

wherein a bottom of the groove and the predetermined breaking part have the second predetermined distance in-between.

6. The array substrate of claim 1, wherein the first predetermined distance and the second predetermined distance are both longer than or equal to 6 mm.

7. The array substrate of claim 1, wherein the scan line and the common line are located at a same layer.

8. An array substrate, comprising:
a data line;
a thin film transistor, comprising a gate, a source, and a drain;
a source wire, wherein one end of the source wire is electrically connected to the source and another end of the source wire is electrically connected to the data line, and the source wire comprises a predetermined breaking part, configured to be cut off to break an electrical connection between the source and the data line; and
a scan line, arranged across the data line, wherein the scan line and the predetermined breaking part have a first predetermined distance in-between, and the first predetermined distance is used to prevent the scan line and the data line from forming a short circuit when a fixing operation is being performed;
a common line, arranged in parallel with the scan line and located at one side of the source wire opposite to the scan line, wherein the common line and the predetermined breaking part have a second predetermined distance in-between, and the second predetermined distance is used to prevent the common line and the data line from forming a short circuit when a fixing operation is being performed.

9. The array substrate of claim 8, wherein the predetermined breaking part is located on one side of the source wire close to the data line.

10. The array substrate of claim 9, wherein the scan line comprises a connecting part and a bending part, the connecting part is electrically connected to the gate, the bending part is connected to one side of the connecting part, which is close to the data line, and the bending part and the predetermined breaking part have the first predetermined distance in-between.

11. The array substrate of claim 10, wherein the bending part comprises a tilting section and a horizontal section connected to the. tilting section, the tilting section comprises a first end and a second end, the. first end is connected to the connecting part and the second end is connected to the horizontal section;

wherein a distance between the tiling section and the predetermined breaking part increases from the first end to the second end, and a distance between the horizontal section and the predetermined breaking part is the first predetermined distance.

12. The array substrate of claim 9, wherein the common line has a groove located on one side of the common line, which is close to the data line;

wherein a bottom of the groove and the predetermined breaking part have the second predetermined distance in-between.

13. The array substrate of claim 8, wherein the first predetermined distance and the second predetermined distance are both longer than or equal to 6 min.

14. The array substrate of claim 8, wherein the scan line and the common line are located at a same layer.

15. The array substrate of claim 8, wherein a plurality of pixel electrodes arranged in an array, wherein each drain is electrically connected to an electrode of the plurality of pixel electrodes in a one-by-one correspondence.

16. A display panel, comprising an array, substrate, the array substrate comprising:
a data line:
a thin film transistor, comprising a gate, a source, and a drain;
a source wire, wherein one end of the source wire is electrically connected to the source and another end of the source wire is electrically connected to the data line, and the source wire comprises a predetermined breaking part, configured to be cut off to break an electrical connection between the source and the data line; and
a scan line, arranged across the data line, wherein the scan line and the predetermined breaking part have a first predetermined distance in-between, and the first predetermined distance is used to prevent the scan line and the data line from forming a short circuit when a fixing operation is being performed; and
a common line, arranged in parallel with the scan line and located at one side of the source wire opposite to the scan line, wherein the common line and the predetermined breaking part have a second predetermined distance in-between. and the second predetermined distance is used to prevent the common line and the data line from forming a short circuit when a fixing operation is being performed.

17. The display panel of claim 16, wherein the predetermined breaking part is located on one side of the source wire close to the data line.

18. The display panel of claim 17, wherein the scan line comprises a connecting part and a bending part, the connecting part is electrically connected to the gate, the bending part is connected to one side of the connecting part, which is close to the data line, and the bending part and the predetermined breaking part have the first predetermined distance in-between.

* * * * *